United States Patent [19]

Soraoka

[11] 4,453,757

[45] Jun. 12, 1984

[54] WAFER GRIPPING DEVICE

[75] Inventor: Minoru Soraoka, Kudamatsu, Japan

[73] Assignee: Hitachi, Ltd., Tokyo, Japan

[21] Appl. No.: 324,121

[22] Filed: Nov. 23, 1981

[30] Foreign Application Priority Data

Nov. 28, 1980 [JP] Japan .................... 55-166545

[51] Int. Cl.³ .............................. B25J 15/00
[52] U.S. Cl. ............................ 294/86 R; 269/233; 294/34
[58] Field of Search .......... 294/67 B, 67 BB, 86 R, 294/103 R, 110 B, 113, 34; 269/156, 217, 218, 229, 232, 233, 235; 279/114; 414/729, 738, 741, 744 A, 751

[56] References Cited

U.S. PATENT DOCUMENTS 167,127   8/1875   Sandbach ............... 269/233 X
351,871  11/1886   Lampert ................ 269/233 X

FOREIGN PATENT DOCUMENTS 54-41075   3/1979   Japan .

*Primary Examiner*—Johnny D. Cherry
*Attorney, Agent, or Firm*—Antonelli, Terry & Wands

[57] ABSTRACT

A wafer gripping device including a mechanism for automatically gripping a wafer by claws for transporting a wafer between an auxiliary vacuum chamber and a vacuum chamber of a semiconductor etching device. The claws for gripping a wafer have a vertical stroke increased when a wafer gripping operation is performed to enable the wafer to be gripped without any damage being caused thereto. The wafer gripping device includes a dust collection preventing member for minimizing dust collection.

14 Claims, 6 Drawing Figures

WAFER GRIPPING DEVICE

BACKGROUND OF THE INVENTION

1. Field of the Invention

This invention relates to a wafer gripping device for a semiconductor fine working device, such as an etching device, ion inplanting device, etc., having an auxiliary vacuum chamber suitable for automatically feeding a wafer from the auxiliary vacuum chamber to a vacuum chamber or in discharging same therefrom.

2. Description of the Prior Art

Heretofore, one type of wafer gripping device for a semiconductor fine working device uses a vacuum chuck system. Another type uses a gripping mechanism including claws. Still another type uses a wafer scooping system using a wafer push-up mechanism in combination. Of all these types, many of them are of the construction that the wafer is attracted under atmospheric pressure after the vacuum chamber is turned into an atmospheric chamber, so as to supply or discharge the wafer.

In the type of wafer gripping device using the gripping mechanism including the claws, a power transmitting system is used which relies on gears for vertically moving the claws to open and close the same. Since no dust preventing means are provided dust collects and the material has a low yield in a semiconductor working operation in which fine working on the order of sub microns is carried out. In the wafer gripping device using a wafer push-up mechanism, the problem is raised that uniformity of etching is lacking in an etching operation due to the need to form a cutout opening in the lower electrode.

Some devices use a guide ring for the wafer to increase uniformity of etching in the etching operation. However, when the vertical stroke of the claws is small, it is impossible to grip the wafer by the claws because the claws pass by the guide ring.

SUMMARY OF THE INVENTION

One object of the present invention resides in providing a wafer gripping device including vertically movable claws having a relatively large stroke and a dust prevention means. Another object of the present invention resides in providing a wafer gripping device suitable for use in carrying out gripping and releasing of a wafer without damaging the same.

According to the invention, a wafer gripping device comprises a head, drum rotatably mounted on the head, a holder fitted to an outer peripheral portion of the drum and vertically movable along vertical movement grooves formed on the outer peripheral portion of the drum, reciprocating rods forced against the drum and supported by the holder, with the reciprocating rods each having a claw attachment to a forward end portion thereof for gripping a wafer and being radially movable along claw opening and closing grooves formed on the outer peripheral portion of the drum and having different depths in a circumferential direction, and a holder cover enclosing the drum and the holder.

DETAILED DESCRIPTION OF THE PREFERRED EMBODIMENT

Figure 1:
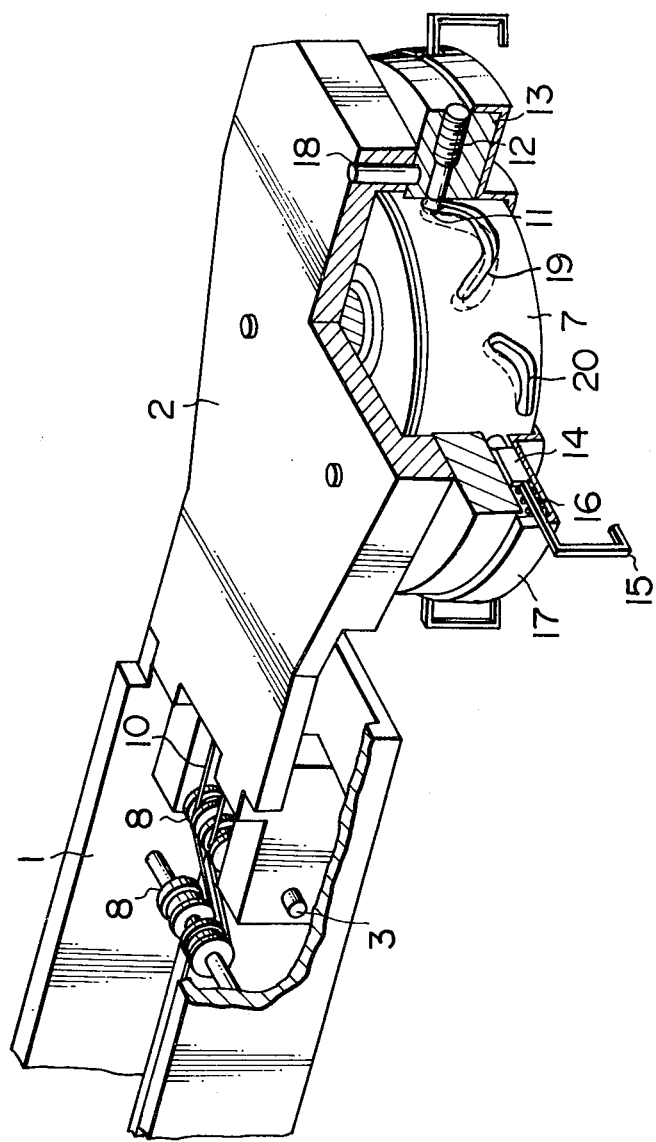
FIG. 1 is a perspective view of the wafer gripping device comprising one embodiment of the invention.
Figure 2:
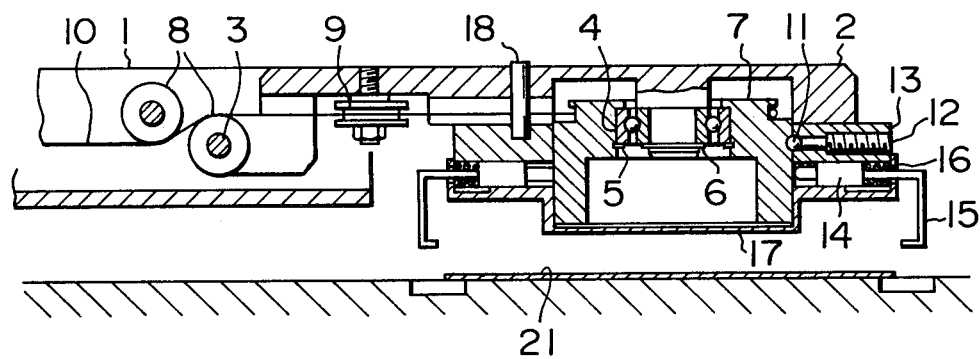
FIG. 2 is a sectional side view of the wafer gripping device shown in FIG. 1.
Figure 3:
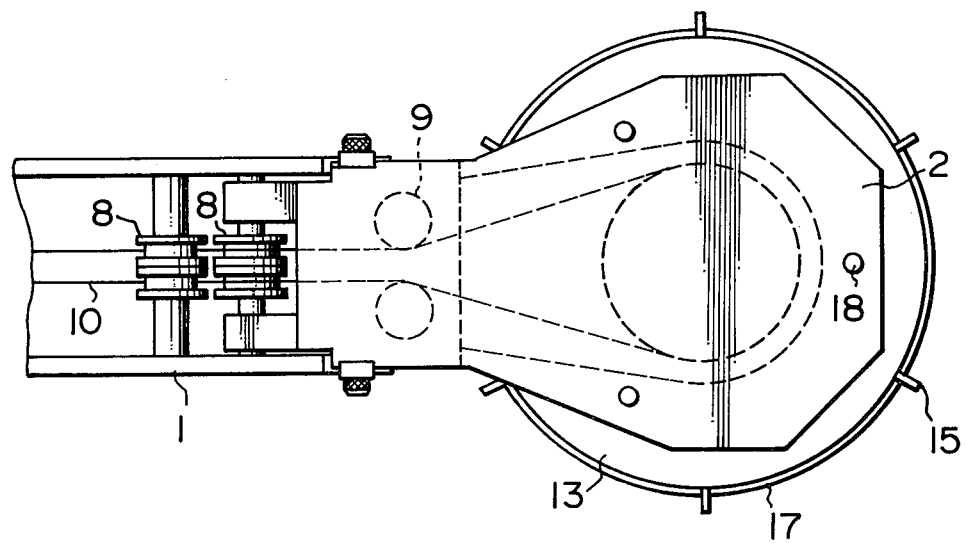
FIG. 3 is a plan view of the wafer gripping device shown in FIG. 1.

Referring now to the drawings wherein like reference numerals are used throughout the various views to designate like parts and, more particularly, to FIGS. 1-3, according to these figures a head 2, formed with a gripping section, is mounted for vertical pivotal movement on an arm 1 through a connecting pin 3, and a drum 7 is mounted on the head 2 through a bearing 4 and stop rings 5 and 6. A drive force transmitting wire 10 extending through an interior of the arm 1 and guided by guide sheaves 8 and 9, is connected to the drum 7, and a holder 13 is fitted to the outer periphery of the drum 7 by a guide ball 11 and a ball hold-down member 12. The holder 13 supports a plurality of claws 15 and springs 16 radially movably mounted on reciprocating rods 14 and has a holder cover 17 attached to its lower portion. A guide bar 18 is inserted through the head 2 and guide grooves 19 for enabling vertical movement of the holder and claw opening and closing guide grooves 20 are provided in the drum 7.

As a drive force is imparted to the wire 10 from outside a vacuum chamber to grip a wafer 21, the drum 7, connected to the wire 10, rotates about the bearing 4 of the head 2 and the holder 13, attached to the drum 7 by the guide ball 11 and the ball hold-down member 12, moves up and down greatly in synchronism with the rotation of the drum 7 along the holder vertical movement guide grooves 19. The claws 15, built in the holder 13 are opened and closed as the reciprocating rods 14, forced by the springs 16 against the outer peripheral portion of the drum 7 have their forward ends inserted in the claw opening and closing grooves 20, to open and close the claws 15, as the drum 7 rotates. By virtue of this operation, the wafer 21, disposed in a predetermined position, can be gripped.

The guide grooves 19 and 20 are formed in such a manner that the claws 15 are opened and closed while the holder 13 dwells in its lower limit region. More specifically, the guide grooves 20 and 19 are configured such that the former have different thicknesses in a circumferential direction and the latter are partly in the form of a straight line extending in a circumferential direction and extending obliquely upwardly at its opposite ends. By virtue of the configuration of the guide grooves 20, as the holder 13 begins to move upwardly while the drum 7 rotates, the claws 15 stop an opening and closing operation and begin to move upwardly with the holder 13 as a unit, so that they can be lifted without rubbing against the undersurface of the wafer 21. Conversely, when the wafer 21 is placed in a predetermined position, the claws 15 are prevented from opening while dragging the wafer 21, so that the wafer 21 can be positively placed in the predetermined position thereby improving the uniformity of etching. In this case, the provision of the holder cover 17 markedly avoids production of dust by the wafer gripping and releasing operation.

Figure 4:
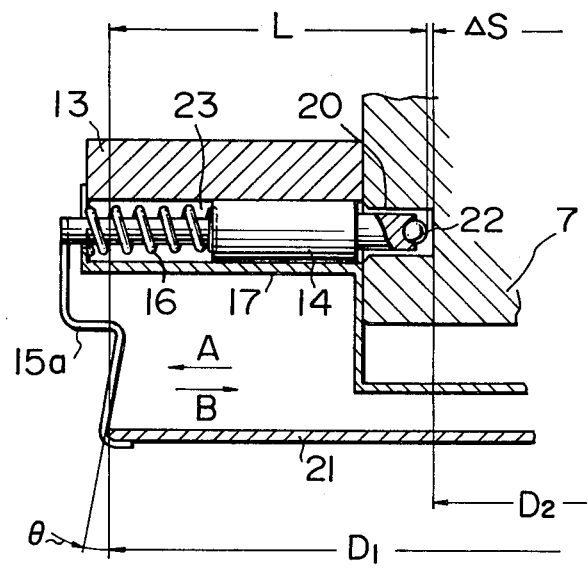
FIG. 4 is a detailed sectional view of the wafer gripping device section.

In the wafer gripping section, as shown in FIG. 4, the claw opening and closing guide grooves 20 are formed at the deepest section thereof with a predetermined relief $\Delta S$ ($>0$). A rolling member 22 is supported at one end of each reciprocating rod 14 having one of the claws 15 and one of the springs 16 is supported at the other end thereof to impart to the wafer 21 a restoring force that does not damage the same. The reciprocating rods 14 are each inserted in one of reciprocating rod guide grooves 23 formed in the holder 13 to enable the rolling member 22 to be inserted in the guide grooves 20. The reciprocating rods 14 each have one of the claws 15 removably attached to the other end, the claws 15 have a wafer gripping section forming an acute angle $\theta$ with respect to the perpendicular.

To prepare for gripping of the wafer 21, the reciprocating rods 14 are moved in a direction of the arrow a resulting in the claws 15 being radially opened, as the drum 7 rotates and the rolling member 22 moves from the deeper portion to the shallow portion of the guide grooves 20 in rolling movement thereby compressing the springs 16. Then, in actually gripping the wafer 21, the drum 7 rotates to move the rolling member 22 from the shallow portion to the deep portion of the guide grooves 20 in rolling movement, so as to move the reciprocating rod 14 in a direction of the arrow B to cause the claws 15 to be radially closed. The presence of the relief $\Delta S$ in the deepest section of the guide grooves 20 prevents the rolling member 22 from contacting the bottom of the guide grooves 20, so only a force by the springs 16 act upon the reciprocating rods 14. Thus, when the spacing interval between the opposed claws 15 is set at a value equal to the minimum diameter $D_{1S}$ ($D_1 = 2 < +D_2$) and the diameter of the wafer 21 is $D_{1S}$, the gap $\Delta S$ is maintained between the rolling member 22 and the bottom of the guide groove 20 and the wafer 21 is gripped by the claws 15 whose gripping sections each form an acute angle $\theta$ with respect to the perpendicular only by the restoring force of the springs 16 in such a manner that the upper and lower portions of the side of the wafer 21 are restrained. When the wafer 21 has a maximum diameter $D_{1L}(D_{1L} > 2< +D_2)$, a spacing corresponding to the gap $\Delta S$ plus ($D_{1L} - D_1$) is maintained between the rolling member 22 and the bottom of the guide grooves 20, so that the wafer 21 is gripped by the claws 15 only by the restoring force of the springs 16.

The provision of the relief $\Delta S$ in the deepest section of the guide grooves 20 brings the rolling member 22, supported by each of the reciprocating rods 14, out of contact with the bottom of the guide grooves 20 when the wafer 21 is gripped by the claws 15. Thus, the wafer 21 is gripped only by the restoring force of the spring 16 so as to prevent the wafer 21 itself or a thin film on the surface of the wafer 21 from being damaged. Also, the claws 15 are constructed such that the angle $\theta$ at which each claw 15 grips the wafer 21 is an acute angle with respect to the perpendicular, so that the upper portion of the side of the wafer 21 is restrained by a constant force at all times and wobbling or dislodging of the wafer 21 can be prevented while the wafer 21 is being transported.

Figure 5:
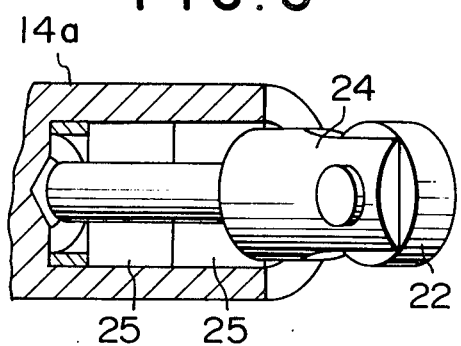
FIG. 5 is a sectional view of a modification of the reciprocating rod inserted in the guide groove.

As shown in FIG. 5, a reciprocating rod 14a may be supported in the guide groove 20 at one end thereof by a pivotal member 24, a bearing 25, and a rolling member 22. The reciprocating rod 14a of this construction offers the advantage of a reduction in the frictional resistance between the guide grooves 20 and the rolling member 22 and an increased smoothness in the radial opening and closing operation of the claws 15, so that the wafer 21 is gripped and released without damaging the surface of the wafer 21 can be prevented with increased positiveness.

Figure 6:
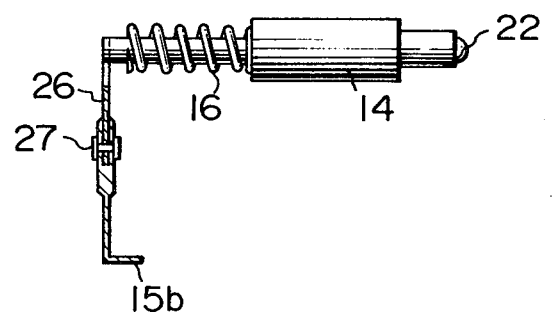
FIG. 6 is a front view of a modification of the claw, showing its construction.

As shown in FIG. 6 a claw 15b, formed of a flexible material or nonmetallic material, such as rubber, synthetic resin, etc., is removably attached by a screw 27 to a support member 26 connected to one end of the reciprocating rod 14. The use of flexible nonmetallic material for forming the claw 15b enables damage to the wafer 21 itself or a thin film on the surface of the wafer 21 to be minimized.

From the foregoing description, it will be appreciated that the present invention enables the stroke of the claws 15, 15a, 15b in a vertical direction to be increased as the wafer gripped operation is carried out, to more positively place the wafer in a predetermined position, when incorporated in an etching device using a guide ring. This is conducive to uniformity of etching performed by the etching device, and enables gripping and releasing of the wafer 21 to be carried out without damaging same. The provision of a holder cover 17 as a dust collection preventing member enables collection of dust to be minimized, so that the gripping device according to the invention is suitable for gripping a wafer 21 on which fine working on the order of sub microns is carried out.

What is claimed is:
1. A wafer gripping device comprising:
a head;
a rotatably driven drum mounted on the head;
a holder fitted to an outer peripheral portion of the drum and vertically movable along grooves formed on an outer peripheral portion of the drum;
reciprocating rods forced against the drum and supported by the holder;
a claw means provided at a first end of each of said reciprocating rods for gripping a wafer;
opening and closing grooves formed on the outer peripheral portion of the drum, said grooves having different depths in a circumferential direction and accommodating said reciprocating rods therein for radial movement so as to enable an opening and closing of said claw means; and
a holder cover means for enclosing the drum and the holder.

2. A wafer gripping device as claimed in claim 1, further comprising a rolling member attached to a second end of each of said reciprocating rods, a spring means associated with each of said reciprocating rods for pressing the reciprocating rods against the opening and closing grooves and the claw means mounted at the first end thereof, and a predetermined relief means for forming a deepest section of said opening and closing grooves.

3. A wafer gripping device as claimed in claim 2, wherein said claw means includes a wafer gripping section angled in an acute angle with respect to the perpendicular.

4. A wafer gripping device as claimed in claim 3, wherein each of said reciprocating rods have a pivotal member connected to the second end thereof through a bearing means and the rolling member is attached to one end of said pivotal member.

5. A wafer gripping device as claimed in claim 4, wherein said gripping claw means are formed of a flexible nonmetallic material.

6. A wafer gripping device as claimed in claim 3, wherein said gripping claw means are formed of a flexible nonmetallic material.

7. A wafer gripping device as claimed in claim 2, wherein each of said reciprocating rods has a pivotal member connected to the second end thereof through a bearing means and the rolling member is attached to one end of said pivotal member.

8. A wafer gripping device according to claim 2, wherein said gripping claw means are formed of a flexible nonmetallic material.

9. A wafer gripping device according to claim 1, wherein said gripping claw means are formed of a flexible nonmetallic material.

10. A wafer gripping device as claimed in claim 1, wherein said claw means includes a wafer gripping section angled in an acute angle with respect to the perpendicular.

11. A wafer gripping device as claimed in claim 10, wherein each of said reciprocating rods has a pivotal member connected to the second end thereof through a bearing means and a rolling member is attached to one end of said pivotal member.

12. A wafer gripping device as claimed in claim 11, wherein said gripping claw means are formed of a flexible nonmetallic material.

13. A wafer gripping device as claimed in claim 1, wherein each of said reciprocating rods has a pivotal member connected to the second end thereof through a bearing means and a rolling member is attached to one end of said pivotal member.

14. A wafer gripping device according to claim 13, wherein said gripping claw means are formed of a flexible nonmetallic material.

* * * * *